United States Patent
Yahav et al.

(10) Patent No.: US 8,461,928 B2
(45) Date of Patent: Jun. 11, 2013

(54) CONSTANT-GAIN POWER AMPLIFIER

(75) Inventors: Nir Yahav, Holon (IL); Igal (Yehuda) Kushnir, Azur (IL)

(73) Assignee: Provigent Ltd. (IL)

( * ) Notice: Subject to any disclaimer, the term of this patent is extended or adjusted under 35 U.S.C. 154(b) by 0 days.

(21) Appl. No.: 13/012,819

(22) Filed: Jan. 25, 2011

(65) Prior Publication Data
US 2012/0188018 A1    Jul. 26, 2012

(51) Int. Cl.
*H03G 3/10* (2006.01)
(52) U.S. Cl.
USPC .......................................... 330/279; 330/297
(58) Field of Classification Search
USPC ............... 330/79, 129, 136, 297, 124 R, 295
See application file for complete search history.

(56) References Cited

U.S. PATENT DOCUMENTS

| | | | |
|---|---|---|---|
| 3,667,043 A * | 5/1972 | Ahlgren | ........................ 455/17 |
| 3,970,951 A | 7/1976 | Hoffman | |
| 5,796,306 A * | 8/1998 | Tsumura | .................... 330/124 R |
| 6,392,479 B2 * | 5/2002 | Miura | ........................... 330/129 |
| 6,710,649 B2 | 3/2004 | Matsumoto et al. | |
| 6,727,759 B2 * | 4/2004 | Nguyen et al. | ................ 330/279 |
| 7,084,704 B2 | 8/2006 | Sowlati | |
| 7,626,467 B1 | 12/2009 | Butenhoff et al. | |

* cited by examiner

*Primary Examiner* — Henry Choe
(74) *Attorney, Agent, or Firm* — Sterne, Kessler, Goldstein & Fox P.L.L.C.

(57) ABSTRACT

A method includes amplifying a non-constant-envelope input signal using a main amplifier having a first gain that varies depending on a supply voltage of the main amplifier. A constant-envelope signal is amplified using a reference amplifier having a second gain that varies depending on the supply voltage of the reference amplifier. Both the main amplifier and the reference amplifier are operated using a same variable supply voltage whose amplitude varies over time. A gain control signal is produced so as to compensate for changes in the second gain of the reference amplifier that are caused by the variable supply voltage. The gain control signal is applied in compensating for variations in the first gain of the main amplifier.

28 Claims, 2 Drawing Sheets

CONSTANT-GAIN POWER AMPLIFIER

FIELD OF THE INVENTION

The present invention relates generally to Radio Frequency (RF) signal amplification, and particularly to methods and systems for reducing gain variations in power amplifiers.

BACKGROUND OF THE INVENTION

RF amplifiers are used in a variety of applications, such as in power amplifiers of wireless transmitters. In some applications it is desirable to control the gain of an RF amplifier, e.g., maintain the gain at a constant level and compensate for gain variations.

Several techniques for controlling amplifier gain are known in the art. For example, U.S. Pat. No. 7,626,467, whose disclosure is incorporated herein by reference, describes an Automatic Level Control (ALC) technique to compensate for variations in the gain of an RF amplifier. The gain of the RF amplifier is controlled as a function of the output of a Voltage Controlled Oscillator (VCO) circuit. The VCO typically includes a buffer amplifier with a structure similar to that of the RF amplifier. By tracking changes in the output of the VCO buffer amplifier, an ALC input to the RF amplifier is adjusted to compensate for process- and temperature-based variations in amplifier gain.

U.S. Pat. No. 6,710,649, whose disclosure is incorporated herein by reference, describes a power amplifier module that includes a plurality of amplifier stages. Each amplifier stage includes a reference amplifier for emulating the operation of the amplifier. The current flowing to the base of a bipolar transistor that forms each reference amplifier depending on an input power level is detected, amplified and supplied as base current of the transistor of the corresponding amplifier.

SUMMARY OF THE INVENTION

An embodiment of the present invention that is described herein provides a method, which includes amplifying a non-constant-envelope input signal using a main amplifier having a first gain that varies depending on a supply voltage of the main amplifier. A constant-envelope signal is amplified using a reference amplifier having a second gain that varies depending on the supply voltage of the reference amplifier. Both the main amplifier and the reference amplifier are operated using a same variable supply voltage whose amplitude varies over time. A gain control signal is produced so as to compensate for changes in the second gain of the reference amplifier that are caused by the variable supply voltage. The gain control signal is applied in compensating for variations in the first gain of the main amplifier.

In some embodiments, a frequency of the constant-envelope signal is higher than an envelope bandwidth of the non-constant-envelope signal. In an embodiment, the main amplifier and the reference amplifier are fabricated on a single substrate and using the same semiconductor process. In a disclosed embodiment, producing the gain control signal includes tracking an output of the reference amplifier. In another embodiment, producing the gain control signal includes applying the gain control signal to the reference amplifier so as to compensate for the changes in the second gain.

In an embodiment, applying the gain control signal includes modifying a control voltage or current in the main amplifier based on the gain control signal. In another embodiment, applying the gain control signal includes adjusting a gain element that precedes the main amplifier. Amplifying the constant-envelope signal may include reusing a signal, which is used for a function other than amplification by the reference amplifier, to serve as the constant-envelope signal. In another embodiment, operating the main amplifier includes modifying the variable supply voltage so as to maximize an efficiency of the main amplifier.

In some embodiments, operating the main amplifier includes modifying the variable supply voltage responsively to an envelope of the input signal. Modifying the variable supply voltage may include alternately selecting a constant-voltage source from among multiple constant-voltage sources so as to track the envelope of the input signal. In a disclosed embodiment, operating the main amplifier includes applying the variable supply voltage as a main supply voltage of the main amplifier. In yet another embodiment, operating the main amplifier includes applying the variable supply voltage as a bias voltage of the main amplifier. In still another embodiment, the method includes setting an average gain level of the main amplifier by adjusting the gain control signal.

There is additionally provided, in accordance with an embodiment of the present invention, apparatus that includes a main amplifier, a reference amplifier, a power supply and control circuitry. The main amplifier is configured to amplify a non-constant-envelope input signal, and has a first gain that varies depending on supply voltage. The reference amplifier is configured to amplify a constant-envelope signal, and has a second gain that varies depending on the supply voltage. The power supply is configured to provide a same variable supply voltage, whose amplitude varies over time, for operating both the main amplifier and the reference amplifier. The gain control circuitry is configured to produce a gain control signal so as to compensate for changes in the second gain of the reference amplifier that are caused by the variable supply voltage, and to apply the gain control signal in compensating for variations in the first gain of the main amplifier.

The present invention will be more fully understood from the following detailed description of the embodiments thereof, taken together with the drawings in which:

DETAILED DESCRIPTION OF EMBODIMENTS

Overview

Embodiments of the present invention that are described herein provide improved methods and systems for controlling the gain of Power Amplifiers (PAs). In particular, these methods and systems are useful for maintaining constant gain in PAs whose gain is affected by rapid variations in supply voltage or operating conditions. An example application of the disclosed techniques is in an Envelope Tracking (ET)

system that modifies the PA supply voltage as a function of the envelope of the amplified signal in order to increase the PA efficiency. In such a system, the amplified signal is usually highly non-constant-envelope, and the PA gain may therefore fluctuate as a result of the rapidly-varying supply voltage.

In some embodiments, a gain control unit compensates for gain variations caused by changes in supply voltage. The gain control unit comprises a reference amplifier, which exhibits similar gain variations to those of the PA. The reference amplifier typically comprises a scaled-down version of the PA that is fabricated on the same substrate and operates at the same temperature and using the same supply voltage as the PA.

The gain control unit comprises a gain control loop, which produces a gain control signal that compensates for gain changes in the reference amplifier that are caused by the changes in supply voltage. This same gain control signal is then applied to the PA in order to compensate for the gain variations of the PA. Since the PA and the reference amplifier have similar gain variations as a function of supply voltage and operating conditions, the gain control signal can be used for correcting the gain variations of the PA with high accuracy.

Unlike the PA, however, the reference amplifier amplifies a constant-envelope signal. Since the gain control loop operates on the constant-envelope signal amplified by the reference amplifier, and not on the rapidly-varying non-constant-envelope signal amplified by the PA, the gain control loop is stable, accurate and fast-converging.

The methods and systems described herein maintain constant PA gain, even when the PA supply voltage changes rapidly and when the PA gain is highly sensitive to variations in supply voltage. When using the disclosed techniques, efficient power amplification schemes such as ET can be applied with little or no degradation in signal quality. Moreover, the disclosed techniques enable the use of low-cost power supplies having relaxed specifications in high-performance amplification schemes, since the effects of power supply variations on the PA are compensated for.

System Description

Figure 1:
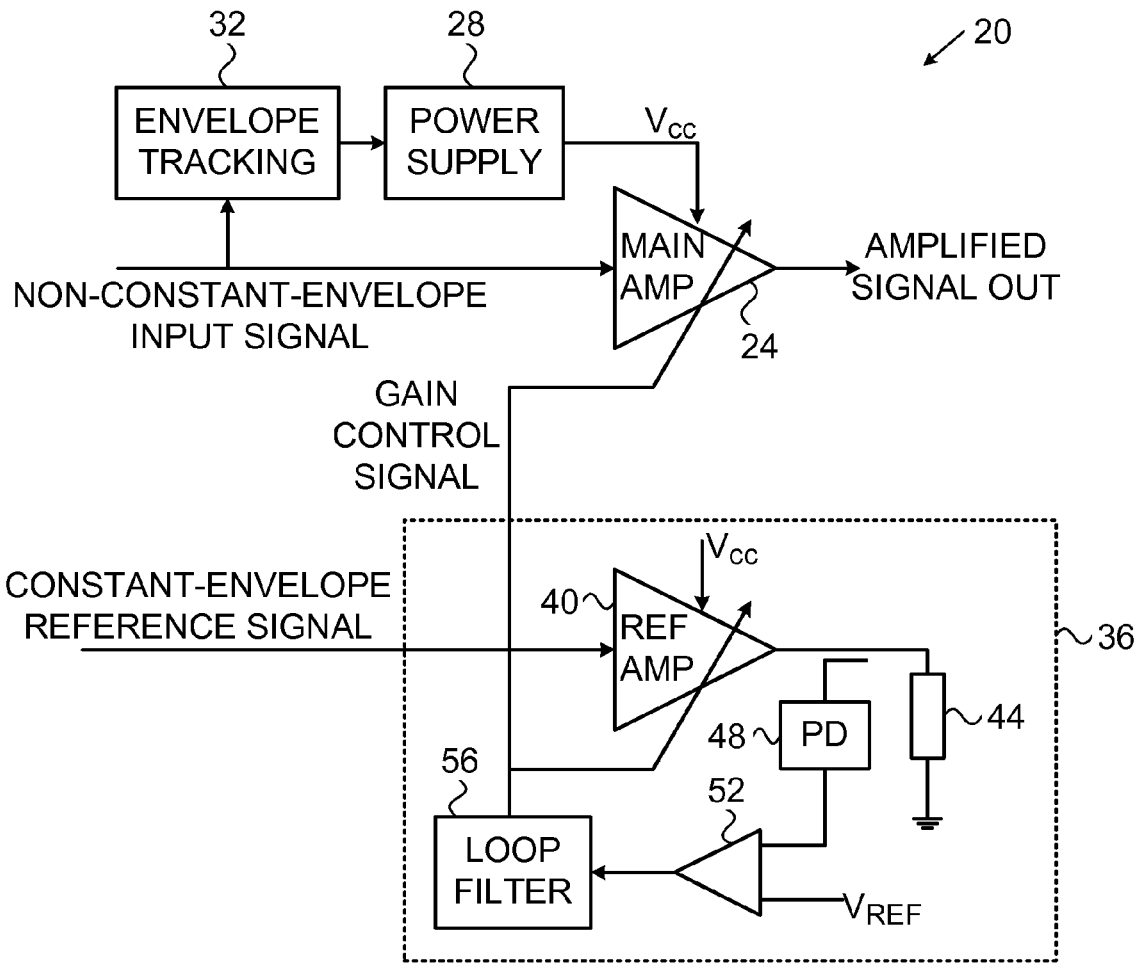
FIG. 1 is a block diagram that schematically illustrates a power amplification system, in accordance with an embodiment of the present invention.

FIG. 1 is a block diagram that schematically illustrates a power amplification system 20, in accordance with an embodiment of the present invention. System 20 can be used, for example, in a transmitter of a microwave or millimeter-wave communication link, in a cellular communication terminal or base stations, or in any other suitable power amplification application.

System 20 comprises a main amplifier 24, which amplifies a non-constant-envelope Radio frequency (RF) input signal. The input signal may comprise any suitable type of signal, for example a signal that is modulated using a non-constant-envelope modulation scheme. The input signal often has a high Peak-to-Average Power Ratio (PAPR). Typically, however, the input signal is to be amplified with little or no degradation in quality, for example in order to comply with specified system performance or regulatory requirements.

System 20 comprises a power supply 28, which provides electrical power for operating main amplifier 24. Power supply 28 produces a supply voltage denoted $V_{cc}$ that is provided to main amplifier 24. In the embodiment of FIG. 1, system 20 uses an Envelope Tracking (ET) scheme for operating the main amplifier at high efficiency. When using ET, the supply voltage of the main amplifier is varied as a function of the complex envelope of the input RF signal, so as to increase the efficiency of the main amplifier.

System 20 comprises an envelope tracking unit 32, which estimates the complex envelope of the input signal and causes power supply 28 to vary $V_{cc}$ accordingly. The variations in supply voltage are typically rapid, on the order of 1/BW, wherein BW denotes the input signal envelope bandwidth. Unit 32 may estimate the signal envelope using any suitable method, such as using a diode-based envelope detector.

In alternative embodiments, the signal envelope is provided to system 20 from an external source, e.g., from a modulator or modem that produces the signal. Using this technique, the external source may control (e.g., delay) the signal envelope that is provided to system 20, and/or generate control signals that improve operation of system 20, and/or compensate for delays in the analog components of system 20.

In practice, the gain of main amplifier 24 is often sensitive to changes in the supply voltage. When unit 32 and power supply 28 cause the supply voltage to track the non-constant envelope of the input signal, the gain of main amplifier 24 may fluctuate. These gain fluctuations may cause degradation in signal quality at the main amplifier output, e.g., deviation from a specified spectral mask or output Signal-to-Noise Ratio (SNR). In many communication systems rapid gain fluctuations are particularly harmful, since they are often too fast to be tracked and corrected digitally at the receiver.

In some embodiments, system 20 comprises a gain control unit 36, which attempts to maintain the gain of main amplifier 24 constant. Unit 36 controls the gain of main amplifier 24 so as to compensate for the gain fluctuations caused by the envelope-tracking variations in supply voltage $V_{cc}$.

In some embodiments, unit 36 closes a gain control loop around a reference amplifier 40, which exhibits similar gain variations to those of main amplifier 24. In an example embodiment, reference amplifier 40 comprises a scaled-down version of main amplifier 24 that is manufactured using the same semiconductor process as the main amplifier. In example embodiments, the reference amplifier is between ten times and a hundred times smaller than the main amplifier. Alternatively, however, any other suitable proportion between the main and reference amplifiers can be used.

In an embodiment, reference amplifier 40 is fabricated on the same semiconductor die as main amplifier 24, such that the main and reference amplifiers are subjected to similar temperature and process variations. The supply voltage that is used for operating reference amplifier 40 is the same supply voltage $V_{cc}$ that is used for operating main amplifier 24, i.e., both amplifiers are subjected to the same supply voltage variations.

In the embodiment of FIG. 1, the gain control loop in unit 36 comprises a power detector 48, which estimates the average power of the amplified signal at the output of the reference amplifier. A comparator 52 compares the estimated power with a reference voltage $V_{REF}$. A loop filter 56 filters the comparator output, so as to produce a gain control signal. Reference amplifier 40 typically outputs its amplified signal into a dummy load 44. In alternative embodiments, any other suitable gain control circuitry can be used. Thus, the gain control circuitry forms a closed gain control loop on the gain of the reference amplifier: The gain control circuitry tracks the output of the reference amplifier, produces the gain control signal and applies it back to the reference amplifier.

The gain control signal produced by the closed gain control loop tracks the gain variations in reference amplifier 40 that are caused by the rapid changes in $V_{cc}$. Since the main and reference amplifiers are subjected to the same supply voltage variations and exhibit similar gain variations as a function of supply voltage, the gain control signal is indicative of the gain variations in the main amplifier, as well. Thus, unit 36 controls the gain of main amplifier 24 using this gain control signal.

Unlike the main amplifier, however, reference amplifier 40 amplifies a constant-envelope signal (typically a sinusoidal Continuous Wave—CW signal whose power level is considerably lower than that of the signal amplified by the main amplifier). Since the gain control loop operates on a constant-envelope signal, it is able to react to gain variations in the reference amplifier with high accuracy and fast convergence time. Operating the loop on a constant-envelope signal enables the gain control loop with short averaging periods and short response times.

Additionally, the signal amplified by the reference amplifier typically has a much higher frequency than the envelope bandwidth of the signal amplified by the main amplifier. In an example embodiment, the envelope bandwidth may be on the order of 100 MHz, while the frequency of the constant-envelope signal may be on the order of several GHz. This high frequency, in addition to the constant envelope, allows the gain control loop to converge rapidly and thus track the rapid gain variations that are encountered in envelope tracking.

If the reference amplifier were to amplify a non-constant-envelope signal (e.g., a replica of the input RF signal), the averaging periods and loop bandwidth of the gain control loop would need to be slow, often slower than the rate of variation of the input signal envelope. In such conditions, the loop would likely fail in compensating for the rapid gain fluctuations of the main amplifier.

The configuration of system 20 shown in FIG. 1 is an example configuration, which is chosen purely for the sake of conceptual clarity. In alternative embodiments, any other suitable configuration can be used. System 20 or parts thereof can be implemented, for example, using discrete components and/or using one or more Radio Frequency Integrated Circuits (RFIC) or Monolithic Microwave Integrated Circuits (MMIC). System elements that are not necessary for understanding of the disclosed techniques have been omitted from he figure for the sake of clarity.

Example Power Supply Configuration

The description that follows describes example power supply configurations, which can be used as part of the envelope tracking configuration of FIG. 1 above. The power supply schemes described herein reduce power consumption and trade it for amplifier linearity when the signal envelope is low. This trade-off is performed without degrading signal quality, since the envelope tracking mechanism ensures that the main amplifier has a sufficiently-high supply voltage at any time and for any momentary envelope value.

Figure 2:
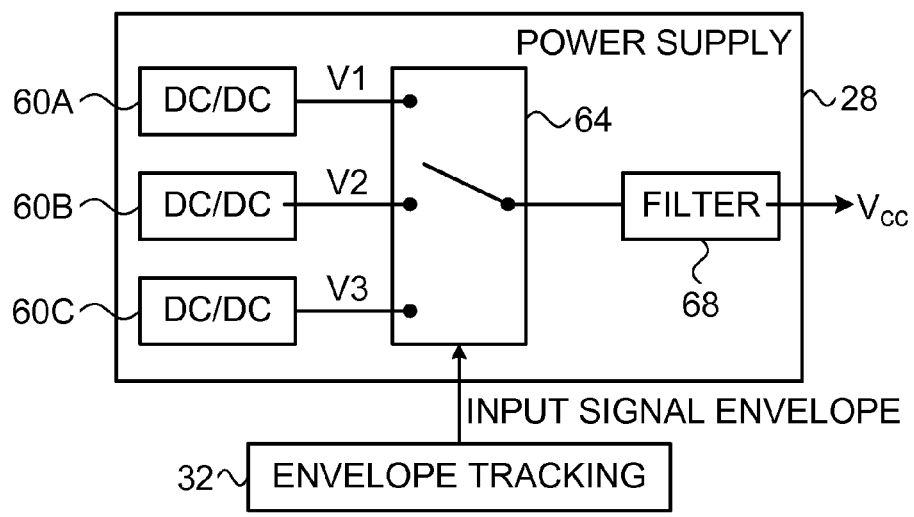
FIG. 2 is a block diagram that schematically illustrates a power supply of a power amplification system, in accordance with an example embodiment of the present invention.

FIG. 2 is a block diagram that schematically illustrates the internal structure of power supply 28, in accordance with an embodiment of the present invention. In the present example, the power supply alternates between three supply voltage levels denoted V1 . . . V3. Power supply 28 comprises three static DC/DC converters 60A . . . 60C, which produce voltages V1 . . . V3, respectively. The static DC/DC converters produce the respective voltages from a certain initial voltage (not shown in the figure). This initial voltage may be higher or lower than the output voltages of the DC/DC converters, or it can even be negative.

A switch 64 alternates between the outputs of the three DC/DC converters. Switch 64 is controlled by envelope tracking unit 32, such that the voltage at the output of the switch tracks (in quantized form) the envelope of the input signal of main amplifier 24. A filter 68 filters the voltage at the output of switch 64, in order to smooth the transitions between voltage levels. The output of filter 68 is provided as output, and is used as the supply voltage for main amplifier 24 and reference amplifier 40. When envelope tracking unit 32 tracks a non-constant-envelope input signal, switch 64 alternates between the three voltage levels so as to track the signal envelope.

In many practical cases, the use of static DC/DC converters is advantageous over using a fast continuous DC/DC converter, since static DC/DC converters are usually common, and have low cost and high efficiency. For example, in order to implement envelope tracking for an envelope bandwidth of 100 MHz, a fast continuous DC/DC converter would typically need to be several times faster. Such a DC/DC converter would typically be expensive and noisy, and its efficiency would be on the order of only 60-80%. Static DC/DC converters, on the other hand, would typically have efficiencies on the order of 90-97%.

The power supply configuration shown in FIG. 2 is an example configuration, which is chosen purely for the sake of conceptual clarity. In alternative embodiments, any other suitable configuration can be used. For example, power supply 28 may alternate among any other suitable number of voltage levels, e.g., two levels or more than three levels. Alternatively to using DC/DC converters, the power supply can be implemented using any other suitable type of constant-voltage sources, which are selected in alternation by unit 32. Further alternatively, the power supply can be implemented using one or more Low Dropout Regulators (LDOs). As yet another example, the power supply may comprise a single DC/DC converter that is controlled by unit 32 to track the signal envelope.

The power supply configuration of FIG. 2 is shown purely by way of example. In alternative embodiments, the disclosed techniques can be carried out using any other suitable power supply having any other suitable configuration.

Figure 3:
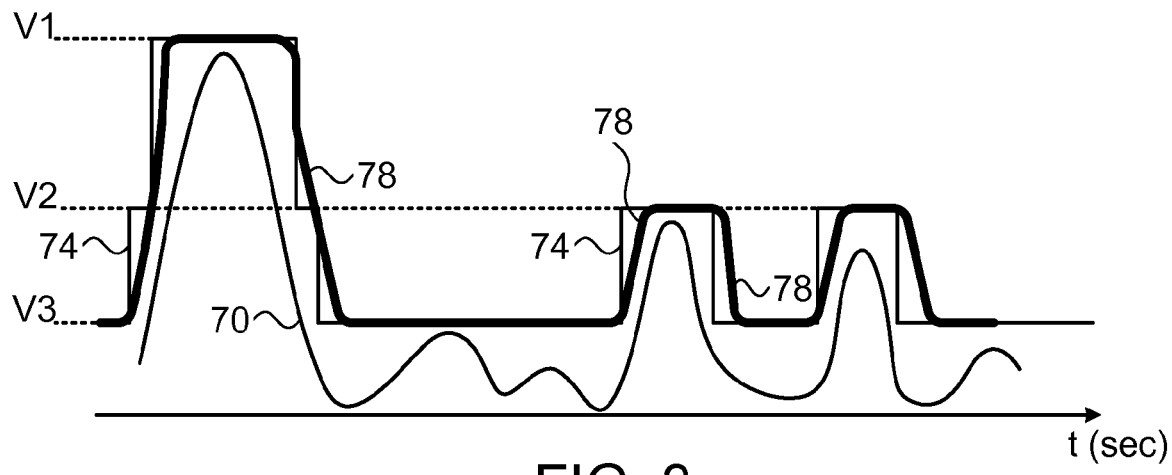
FIG. 3 is a graph showing voltage waveforms in a power supply of a power amplification system, in accordance with an embodiment of the present invention.

FIG. 3 is a graph showing voltage waveforms in a power supply of a power amplification system, in accordance with an embodiment of the present invention. The example of FIG. 3 illustrates the waveforms at different points in power supply 28 while tracking the envelope of a certain non-constant-envelope input signal.

A waveform 70 shows the signal envelope, e.g., at the output of envelope tracking unit 32 or at the control input of switch 64. In the present example, envelope tracking unit 32 translates the signal envelope to a digital signal for controlling switch 64. A waveform 74 shows the alternating voltage at the output of switch 64. As can be seen in the figure, the output of switch 64 alternates between voltages V1, V2 and V3 so as to approximate the signal envelope. A waveform 78 shows the smoothed voltage at the output of filter 68. This voltage is provided as supply voltage $V_{cc}$.

Additional Embodiments and Variations

In the embodiments described above, the variable power supply modifies the main supply voltage $V_{cc}$ of the main and reference amplifiers. In alternative embodiments, other voltages, such as various biasing voltages of the amplifiers, can be modified in this manner in order to achieve high main amplifier efficiency. The methods and systems described herein can be applied to any such voltage. Thus, the term "supply voltage" is used in a broad sense and refers to any voltage that is used by the main and reference amplifiers.

As explained above, gain control unit 36 (FIG. 1) controls the gain of main amplifier 24 using the gain control signal. In various embodiments, unit 36 may use the gain control signal in various ways to compensate for the gain variations of amplifier 24. In the embodiment of FIG. 1, for example, unit 36 applies the gain control signal to the main amplifier itself, e.g., by modifying a bias voltage, bias current or other control voltage or current in the main amplifier. In alternative embodiments, unit 36 may use the gain control signal to modify the gain of a gain element that precedes the main amplifier in system 20.

Such a gain element may comprise, for example, a pre-amplifier or driver amplifier that drives the main amplifier, a pre-distortion element that pre-distorts the input signal before it is amplified by the main amplifier, a variable attenuator, or any other suitable gain element. The gain element may be implemented at RF, at Intermediate Frequency (IF) or at baseband. In some embodiments the controlled gain may be implemented digitally, e.g., in a modem that produces a digital signal that is subsequently converted into the input RF signal.

In some embodiments, the constant-envelope signal amplified by reference amplifier 40 may comprise a signal that is already present in system 20 for other purposes. For example, a Local Oscillator (LO) signal that is used for frequency conversion elsewhere in system 20 can be reused as a the constant-envelope signal amplified by the reference amplifier. This technique eliminates the need for additional signal generation circuitry that generates the constant-envelope signal.

Power Amplification Method Description

Figure 4:
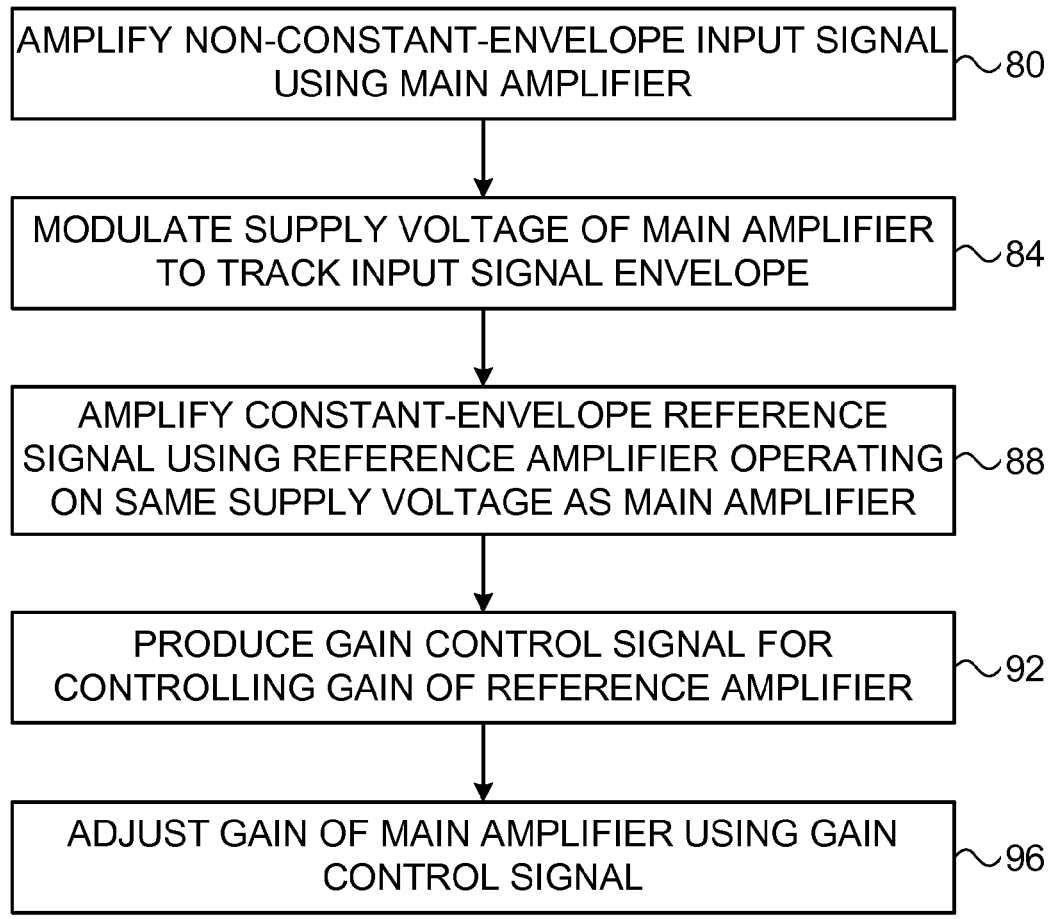
FIG. 4 is a flow chart that schematically illustrates a method for power amplification, in accordance with an embodiment of the present invention.

FIG. 4 is a flow chart that schematically illustrates a method for power amplification, in accordance with an example embodiment of the present invention. The method begins with main amplifier 24 amplifying a non-constant-envelope RF input signal, at a main amplification step 80. Envelope tracking unit 32 and power supply 28 modulate the supply voltage of the main amplifier so as to track the complex envelope of the input signal, at an envelope tracking step 84.

Reference amplifier 40 amplifies a constant-envelope reference signal, whose frequency is higher in comparison with the envelope bandwidth of the non-constant-envelope signal that is amplified by the main amplifier, at a reference amplification step 88. As explained above, the main and reference amplifiers have similar gain variations as a function of supply voltage, and both operate on the same variable supply voltage. Gain control unit 36 produces a gain control signal that compensates for the gain variations in the reference amplifier, at a gain control generation step 92. As explained above, the gain control loop generates the gain control signal by operating on the constant-envelope reference signal. Unit compensates for the gain variations in the main amplifier using the gain control signal, at a compensation step 96.

In some embodiments, the disclosed techniques can also be used for setting the average gain of system 20, e.g., in a transmitter AGC loop. (The average gain is defined over a bandwidth that is considerably narrower than the envelope bandwidth, and is therefore defined regardless of rapid envelope-related gain variations.) In an example embodiment, the absolute gain of system 20 is set by setting the $V_{REF}$ signal at the input of comparator 52 (FIG. 1). Varying $V_{REF}$ will change the gain of the reference amplifier, which will in turn cause a corresponding change in the gain of the main amplifier because both amplifiers are controlled by the same gain control signal.

This gain setting scheme is accurate and reliable, since it operates on the constant-envelope signal and does not depend on sensing the non-constant-envelope modulated signal at the output of the main amplifier. Sensing the non-constant-envelope signal may introduce errors, for example because it is often not a true Root-Mean-Square (RMS) measurement. Such errors are particularly significant in transmitters that modify the modulation order (e.g., Adaptive Coding and Modulation—ACM transmitters). Implementing the transmitter AGC using the disclosed techniques, on the other hand, eliminates these errors because the transmitter gain is set based on a constant-envelope signal.

Although the embodiments described herein mainly address compensation for gain variations in envelope tracking systems, the methods and systems described herein can also be used in other applications, such as in other high-efficiency transmission schemes that modify an amplifier's supply voltage, or in other applications that modify the amplifier's supply voltage over time for other purposes.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method, comprising:
 amplifying a non-constant-envelope input signal using a main amplifier having a first gain that varies depending on a variable supply voltage;
 amplifying a constant-envelope signal using a reference amplifier having a second gain that varies depending on the variable supply voltage;
 producing a gain control signal based on the amplified constant-envelope signal;
 compensating for changes in the second gain of the reference amplifier using the gain control signal; and
 compensating for changes in the first gain of the main amplifier using the gain control signal.

2. The method according to claim 1, wherein a frequency of the constant-envelope signal is higher than an envelope bandwidth of the non-constant-envelope signal.

3. The method according to claim 1, wherein the main amplifier and the reference amplifier are fabricated on a single substrate and using the same semiconductor process.

4. The method according to claim 1, wherein producing the gain control signal comprises tracking an output of the reference amplifier.

5. The method according to claim 1, wherein compensating for changes in the second gain comprises applying the gain control signal to the reference amplifier.

6. The method according to claim 1, wherein compensating for changes in the first gain comprises modifying a control voltage or current in the main amplifier based on the gain control signal.

7. The method according to claim 1, wherein compensating for changes in the first gain comprises adjusting a gain element that precedes the main amplifier.

8. The method according to claim 1, wherein the constant-envelope signal comprises a signal that is used for a function other than amplification by the reference amplifier.

9. The method according to claim 1, further comprising modifying the variable supply voltage so as to maximize an efficiency of the main amplifier.

10. The method according to claim 1, further comprising modifying the variable supply voltage responsively to an envelope of the input signal.

11. The method according to claim 10, wherein modifying the variable supply voltage comprises alternately selecting a constant-voltage source from among multiple constant-voltage sources so as to track the envelope of the input signal.

12. The method according to claim 1, wherein the variable supply voltage is a main supply voltage of the main amplifier.

13. The method according to claim 1, wherein the variable supply voltage is a bias voltage of the main amplifier.

14. The method according to claim 1, further comprising setting an average gain level of the main amplifier by adjusting the gain control signal.

15. Apparatus, comprising:
a main amplifier, which is configured to amplify a non-constant-envelope input signal, and which has a first gain that varies depending on a variable supply voltage;
a reference amplifier, which is configured to amplify a constant-envelope signal, and which has a second gain that varies depending on the variable supply voltage; and
gain control circuitry, which is configured to produce a gain control signal based on the amplified constant-envelope signal that is used to compensate for changes in the second gain of the reference amplifier and for changes in the first gain of the main amplifier.

16. The apparatus according to claim 15, wherein a frequency of the constant-envelope signal is higher than an envelope bandwidth of the non-constant-envelope signal.

17. The apparatus according to claim 15, wherein the main amplifier and the reference amplifier are fabricated on a single substrate and using the same semiconductor process.

18. The apparatus according to claim 15, wherein the gain control circuitry is configured to produce the gain control signal by tracking an output of the reference amplifier.

19. The apparatus according to claim 15, wherein the gain control circuitry is configured to apply the gain control signal to the reference amplifier.

20. The apparatus according to claim 15, wherein the gain control unit is configured to modify a control voltage or current in the main amplifier based on the gain control signal.

21. The apparatus according to claim 15, wherein the gain control unit is configured to adjust a gain element that precedes the main amplifier.

22. The apparatus according to claim 15, wherein the constant-envelope signal comprises a signal that is used for a function other than amplification by the reference amplifier.

23. The apparatus according to claim 15, further comprising a power supply configured to modify the variable supply voltage so as to maximize an efficiency of the main amplifier.

24. The apparatus according to claim 23, further comprising an envelope tracking unit, which is configured to cause the power supply to modify the variable supply voltage responsively to an envelope of the input signal.

25. Apparatus, comprising:
a main amplifier, which is configured to amplify a non-constant-envelope input signal, and which has a first gain that varies depending on a variable supply voltage;
a reference amplifier, which is configured to amplify a constant-envelope signal, and which has a second gain that varies depending on the variable supply voltage;
gain control circuitry, which is configured to produce a gain control signal based on the amplified constant-envelope signal that is used to compensate for changes in the second gain of the reference amplifier and for changes in the first gain of the main amplifier;
a power supply configured to modify the variable supply voltage so as to maximize an efficiency of the main amplifier;
an envelope tracking unit, which is configured to cause the power supply to modify the variable supply voltage responsively to an envelope of the input signal,
wherein the power supply comprises multiple voltage sources, and is configured to modify the supply voltage by alternately selecting a constant-voltage source from among the multiple constant-voltage sources so as to track the envelope of the input signal.

26. The apparatus according to claim 15, wherein the variable supply voltage comprises a main supply voltage of the main amplifier.

27. The apparatus according to claim 15, wherein the variable supply voltage comprises a bias voltage of the main amplifier.

28. The apparatus according to claim 15, wherein the gain control circuitry is configured to set an average gain level of the main amplifier by adjusting the gain control signal.

* * * * *